(12) United States Patent
Long et al.

(10) Patent No.: US 9,384,948 B2
(45) Date of Patent: Jul. 5, 2016

(54) HAMMERHEAD TCP COIL SUPPORT FOR HIGH RF POWER CONDUCTOR ETCH SYSTEMS

(71) Applicant: Lam Research Corporation, Fremont, CA (US)

(72) Inventors: Maolin Long, Cupertino, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 631 days.

(21) Appl. No.: 13/924,477

(22) Filed: Jun. 21, 2013

(65) Prior Publication Data

US 2014/0367045 A1    Dec. 18, 2014

Related U.S. Application Data

(60) Provisional application No. 61/834,786, filed on Jun. 13, 2013.

(51) Int. Cl.
*C23C 16/00* (2006.01)
*H01L 21/306* (2006.01)
*H01J 37/32* (2006.01)

(52) U.S. Cl.
CPC ....... *H01J 37/3211* (2013.01); *H01J 37/32119* (2013.01)

(58) Field of Classification Search
CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ....... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 2003/0067273 A1* | 4/2003 | Benjamin | H01J 37/321 315/111.21 |
| 2005/0145341 A1* | 7/2005 | Suzuki | H01J 37/321 156/345.49 |
| 2005/0194355 A1* | 9/2005 | Lohokare | H01J 37/321 216/68 |
| 2006/0121210 A1* | 6/2006 | Kim | B08B 7/0035 427/569 |

* cited by examiner

*Primary Examiner* — Luz Alejandro Mulero
(74) *Attorney, Agent, or Firm* — Martine Penilla Group, LLP (57) ABSTRACT

The chamber, having a ceramic window disposed in a ceiling of the chamber is provided. Included is a ceramic support having a plurality of spokes that extend from a center region to an outer periphery, and each of the spokes include a hammerhead shape that radially expands the ceramic support in a direction that is away from an axis of a spoke. Also included is a plurality of screw holes disposed through the ceramic support. The plurality of screw holes defined to enable screws to connect to a TCP coil having an inner and outer coil. The outer coil is to be disposed under the hammerhead shape of each of the spokes, and a radial gap is defined between each of the hammerhead shapes. The radial gap defines a non-continuous ring around the outer coil. A plurality of screws are disposed through the screw holes for attaching the TCP coil.

20 Claims, 8 Drawing Sheets

SEE FIG. 3B

HAMMERHEAD TCP COIL SUPPORT FOR HIGH RF POWER CONDUCTOR ETCH SYSTEMS

CLAIM OF PRIORITY

This application claims priority to U.S. Provisional Application No. 61/834,786, filed on Jun. 13, 2013, and entitled "Hammerhead TCP Coil Support for High RF Power Conductor Etch Systems." The disclosure of this application is incorporated herein by reference in its entirety for all purposes.

FIELD OF THE INVENTION

The present invention relates generally to semiconductor fabrication, and more particularly, plasma chambers and structures/devices used in such chambers.

DESCRIPTION OF THE RELATED ART

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

A plasma contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

It is in this context that embodiments related to plasma processing chambers, equipment, parts and operations arise.

SUMMARY

Disclosed are devices, systems, chambers and ceramic supports for use in plasma processing chambers. The plasma processing chambers can be configured for etching wafers/substrates, and in particular layers of dielectric or metal materials. A ceramic support for use in plasma processing etch chambers is provided. The processing etch chamber is a transformer coupled plasma (TCP) coil system, and the ceramic support is used to support the TCP coil. In the embodiments defined herein, the ceramic support includes a hammerhead shape at the radial extensions of the support. The hammerhead design, along with the placement of screws and use of non-threaded screws, act to provide for more efficient processing, with reduced possibilities for arcing between the screws used to support the TCP coil.

In one embodiment, a plasma processing system a substrate support is provided. The system includes a chamber for plasma processing a substrate when disposed over a substrate support of the chamber. The chamber has a ceramic window oriented over the substrate support. The system includes a transformer coupled plasma (TCP) coil defined by an inner coil and an outer coil, and the TCP coil is disposed over the ceramic window. Further included is a ceramic support disposed over to the TCP coil. The ceramic support includes a plurality of spokes that extend from a center region to an outer periphery. Each of the spokes include a hammerhead shape that radially expands the ceramic support in a direction that is away from an axis of a spoke. The system also includes a plurality of screws connecting TCP coil to the ceramic support. At least a pair of screws connected to the outer coil are radially offset from each other and one of the pair of screws is disposed in the hammerhead shape. The ceramic support, using the plurality of screws, support the TCP coil over the ceramic window of the chamber.

In some embodiments, the ceramic support includes a plurality of screw holes for receiving the plurality of screws, the plurality of screw holes being non-treaded; and wherein each of the plurality of screws includes a non-threaded section and a threaded section, the non-threaded section defined to sit in the non-threaded screw holes and the threaded section defined to thread into a threaded of the TCP coil.

In some embodiments, the plurality of spokes are aligned along a support axis and a terminal axis.

In some embodiments, the system further includes a first terminal support connected to the ceramic support at a first end of a spoke aligned along the terminal axis; and a second terminal support connected to the ceramic support at a second end of the spoke aligned along the terminal axis.

In some embodiments, the first and second terminal supports connect to a first terminal body and a second terminal body, respectively, the first and second terminal bodies being held elevated off of the ceramic support by the first and second terminal supports.

In some embodiments, the ceramic support includes elongated passages under terminals of the TCP coil at opposite outer ends of spokes aligned along the terminal axis.

In some embodiments, the radial offset is an angel that extends from a center region of the ceramic support and extends to screw holes defined in the outer periphery of the ceramic support.

In some embodiments, also included is a plurality of passages defined along the terminal axis, the passages being sized to enable terminals connected to the TCP coil to pass through and reside without contact maintained by a spacing with the ceramic support.

In some embodiments, on one of the spokes three screws are provided, wherein a first screw is disposed through a first side of the hammerhead shape, a second screw is disposed through a spoke region, and a third screw is disposed through a second side of the hammerhead shape, wherein the first side, the second side and the spoke region define the hammer head shape.

In some embodiments, the first screw connects to an inner portion of the outer coil, the second screw connects to a middle portion of the outer coil, and the third screw connects to an outer portion of the outer coil.

A device for use in a plasma processing system is provided. The device includes a ceramic support having a plurality of spokes that extend from a center region to an outer periphery, and each of the spokes include a hammerhead shape that radially expands the ceramic support in a direction that is away from an axis of a spoke. A plurality of screw holes are disposed through the ceramic support, and the plurality of screw holes are defined to enable screws to connect to a TCP coil having an inner and outer coil. The outer coil is to be disposed under the hammerhead shape of each of the spokes, and a radial gap is defined between each of the hammerhead shapes. The radial gap defining a non-continuous ring around the outer coil.

In some embodiments, at least a pair of screw holes are radially offset from each other and one of the pair of screw holes is disposed in the hammerhead shape.

In some embodiments, also included is a plurality of screws, the plurality of screws defined to fit through the screw holes, the screws including a non-threaded section and a threaded section, the non-threaded section configured to reside in the screw holes and the threaded sections configured to thread into the TCP coil.

In some embodiments, the plurality of spokes include four spokes, wherein two spokes are aligned along a support axis and two spokes are aligned along a terminal axis.

In some embodiments, also included is a first terminal support connected to the ceramic support at a first end of a spoke aligned along the terminal axis; and a second terminal support connected to the ceramic support at a second end of the spoke aligned along the terminal axis.

In some embodiments, the first and second terminal supports connect to a first terminal body of the TCP coil and a second terminal body, respectively, the first and second terminal bodies being held elevated off of the ceramic support by the first and second terminal supports.

In some embodiments, also included is a center ceramic support, the center ceramic support defining a loop that is disposed over the inner coil of the TCP coil when present, the center ceramic support defining a structure form which the spokes extend out from to the hammer head shapes.

In another embodiment, a chamber is provided. The chamber has walls and defining a volume for processing plasma. The chamber has a ceramic window disposed in a ceiling of the chamber. Also included is a ceramic support having a plurality of spokes that extend from a center region to an outer periphery, and each of the spokes include a hammerhead shape that radially expands the ceramic support in a direction that is away from an axis of a spoke. Also included is a plurality of screw holes disposed through the ceramic support. The plurality of screw holes defined to enable screws to connect to a TCP coil having an inner and outer coil. The outer coil is to be disposed under the hammerhead shape of each of the spokes, and a radial gap is defined between each of the hammerhead shapes. The radial gap defines a non-continuous ring around the outer coil. A plurality of screws are disposed through the screw holes for attaching the TCP coil to the ceramic support, and the ceramic support disposes the TCP coil over the ceramic window.

In some embodiments, at least a pair of screw holes are radially offset from each other and one of the pair of screw holes is disposed in the hammerhead shape.

In some embodiments, the screws include a non-threaded section and a threaded section, the non-threaded section configured to reside in the screw holes and the threaded sections configured to thread into the TCP coil.

BRIEF DESCRIPTION OF THE DRAWINGS

The invention, together with further advantages thereof, may best be understood by reference to the following description taken in conjunction with the accompanying drawings.

DETAILED DESCRIPTION

Disclosed are structures for supporting coils used in transformer coupled plasma (TCP) powered chambers. The coils include inner and outer coils. In one embodiment, the outer coils are supported by a ceramic support structure that includes a plurality of spokes that terminate in hammerhead shapes. The hammerhead shapes at the end of the spokes provide for screw locations for supporting the coils. The screw locations are preferably spaced apart from each other in locations where the possibility of arcing would be present, but for the separations. The separations enable screws connected to coils where high voltage potential differences exist to be separated. In one embodiment, the separation along the hammerhead sections of the ceramic support is provided by radial separation.

In another embodiment, certain terminals are elevated from the ceramic support, and the ceramic support is provided with ceramic cutouts (passages) around the outermost terminals. This elevated configuration and cutouts assist to reduce the E field around the outermost terminals. Still further, embodiments are provided where smooth shank screws are used to mount the coil to the hammerhead ceramic support, which reduces the E field concentration caused by the screw threads in the ceramic section.

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Figure 1:
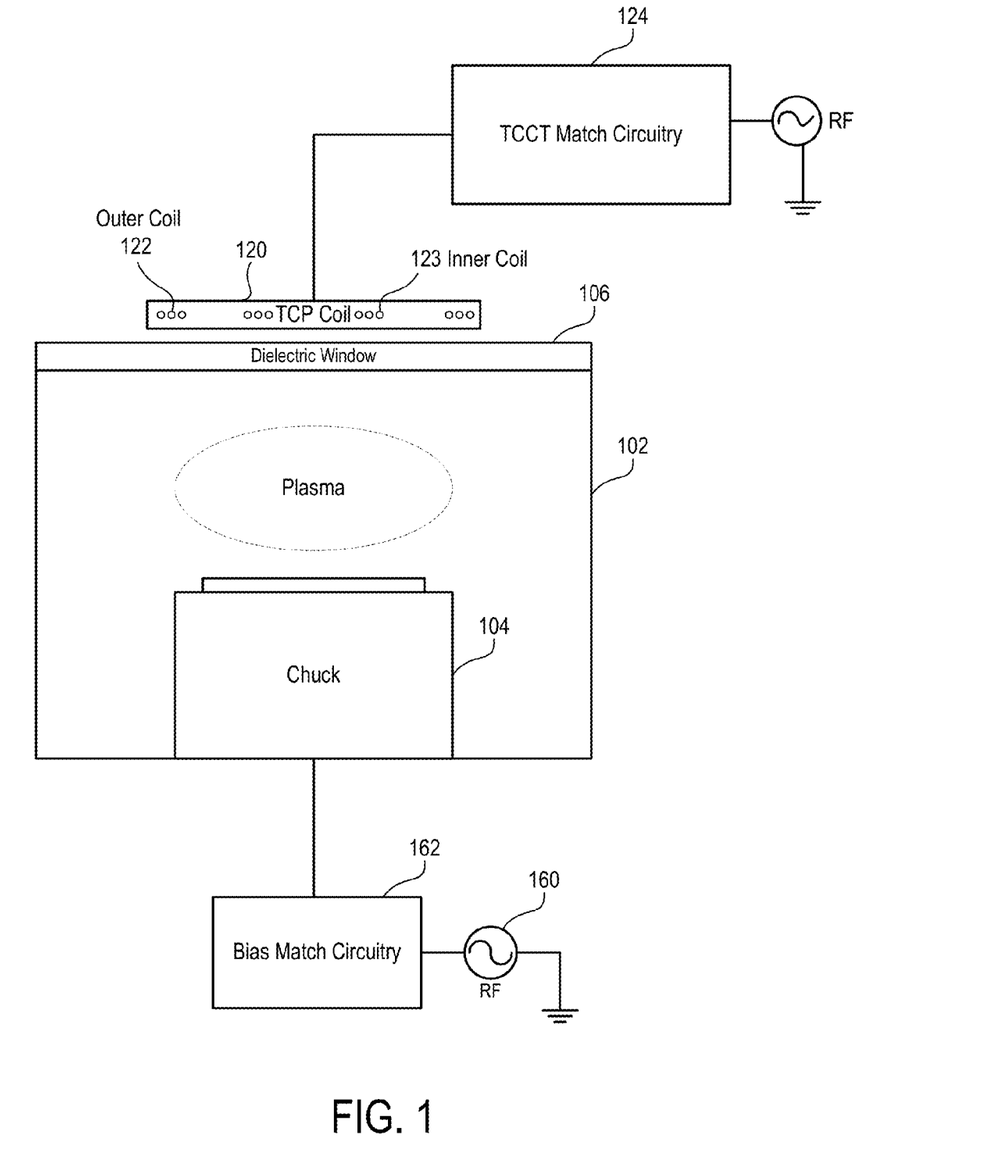
FIG. 1 illustrates a plasma processing system utilized for etching operations, in accordance with one embodiment of the present invention.

FIG. 1 illustrates a plasma processing system utilized for etching operations, in accordance with one embodiment of the present invention. The system includes a chamber 102 that includes a chuck 104, a dielectric window 106, and a TCP coil 120 (inner and outer). The chuck 104 can be an electrostatic chuck for supporting the substrate when present.

Further shown is a bias RF generator 160, which can be defined from one or more generators. If multiple generators are provided, different frequencies can be used to achieve various tuning characteristics. A bias match 162 is coupled between the RF generators 160 and a conductive plate of the assembly that defines the chuck 104. The chuck 104 also includes electrostatic electrodes to enable the chucking and dechucking of the wafer. Broadly, a filter and a DC clamp power supply can be provided. Other control systems for lifting the wafer off of the chuck 104 can also be provided. Although not shown, pumps are connected to the chamber 102 to enable vacuum control and removal of gaseous byproducts from the chamber during operational plasma processing.

The dielectric window 106 can be defined from a ceramic type material. Other dielectric materials are also possible, so long as they are capable of withstanding the conditions of a semiconductor etching chamber. Typically, chambers operate at elevated temperatures ranging between about 50 Celsius and about 120 Celsius. The temperature will depend on the etching process operation and specific recipe. The chamber 102 will also operate at vacuum conditions in the range of between about 1 m Torr (mT) and about 100 m Torr (mT). Although not shown, chamber 102 is typically coupled to facilities when installed in a clean room, or a fabrication facility. Facilities include plumbing that provide processing gases, vacuum, temperature control, and environmental particle control.

These facilities are coupled to chamber 102, when installed in the target fabrication facility. Additionally, chamber 102 may be coupled to a transfer chamber that will enable robotics to transfer semiconductor wafers into and out of chamber 102 using typical automation.

TCCT match circuitry 124 enables dynamic tuning of power provided to the inner and outer coils. The TCP coil 120 is coupled to the TCCT match circuitry 124 which includes connections to the inner coil (IC) 123, and outer coil (OC) 122. In one embodiment, the TCCT match circuitry 124 is configured to tune the TCP coil to provide more power to the inner coil 123 versus the outer coil 122. In another embodiment, the TCCT match circuitry 124 is configured to tune the TCP coil to provide less power to the inner coil 123 versus the outer coil 122. In another embodiment, the power provided to the inner coil and the outer coil will be to provide an even distribution of power and/or control the ion density in a radial distribution over the substrate (i.e., wafer, when present). In yet another embodiment, the tuning of power between the outer coil and the inner coil will be adjusted based on the processing parameters defined for that etching being performed on the semiconductor wafer disposed over chuck 104.

Figure 2A:
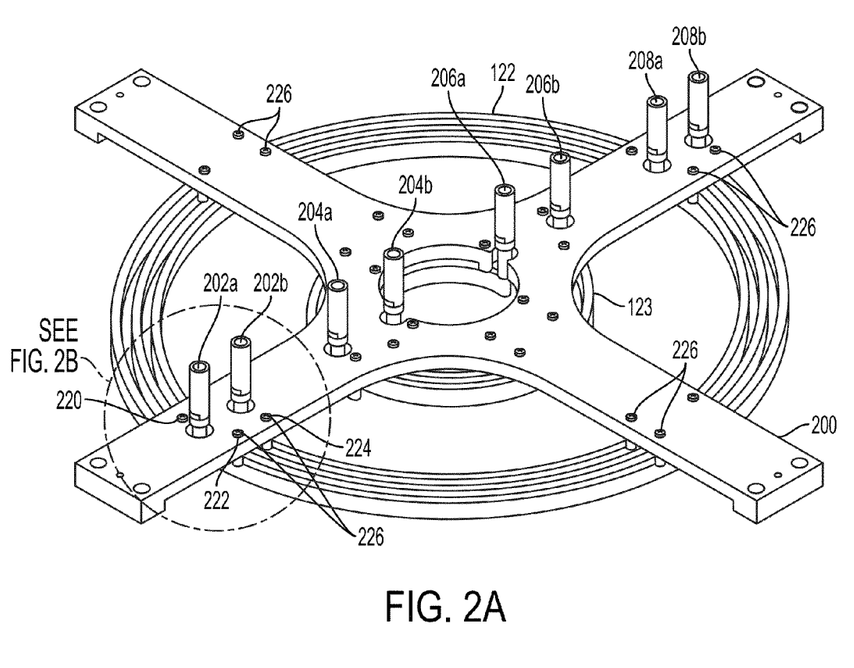
FIG. 2A illustrates one embodiment of the ceramics port disposed over inner and outer coils of the TCP coil.

FIG. 2A illustrates a ceramic support 200, used to support the inner coil 123 and the outer coil 122, in a TCP etch chamber. As discussed above, the TCP coil is configured to sit over dielectric window 106, and the ceramic support 200 will hold the TCP coil above the ceramic window 106, which sits over chamber 102. The ceramic support 200 is configured to attach to the coils using screws, shown by way of example as 223, 222, 224 and others, including screw sets for supporting the inner coil 123. In one embodiment, the TCP coil is made of copper with surface being coated by Xylon (or other suitable coating), and the screws are stainless steel screws. The screws in the design of FIG. 2A are fully threaded screws, from head to end. The TCP coil is connected to RF power by way of terminals 202a, 202b, 204a, 204b, 206a, 206b, and 208a, 208b.

These terminals coupled directly to selected locations on the TCP coil, so as to deliver the desired power to the chamber, which may be running a process operation. In this illustration, the ceramic support 200 uses screws to support the coils during the delivery of RF power to the coils. It has been observed that the configuration of the screws will cause unexpected arcing between selected adjacent screws that are holding the TCP coil. For example, screw pairs 226 have been observed to cause damage 232 (shown in FIGS. 2C and 2D).

Figure 2B:
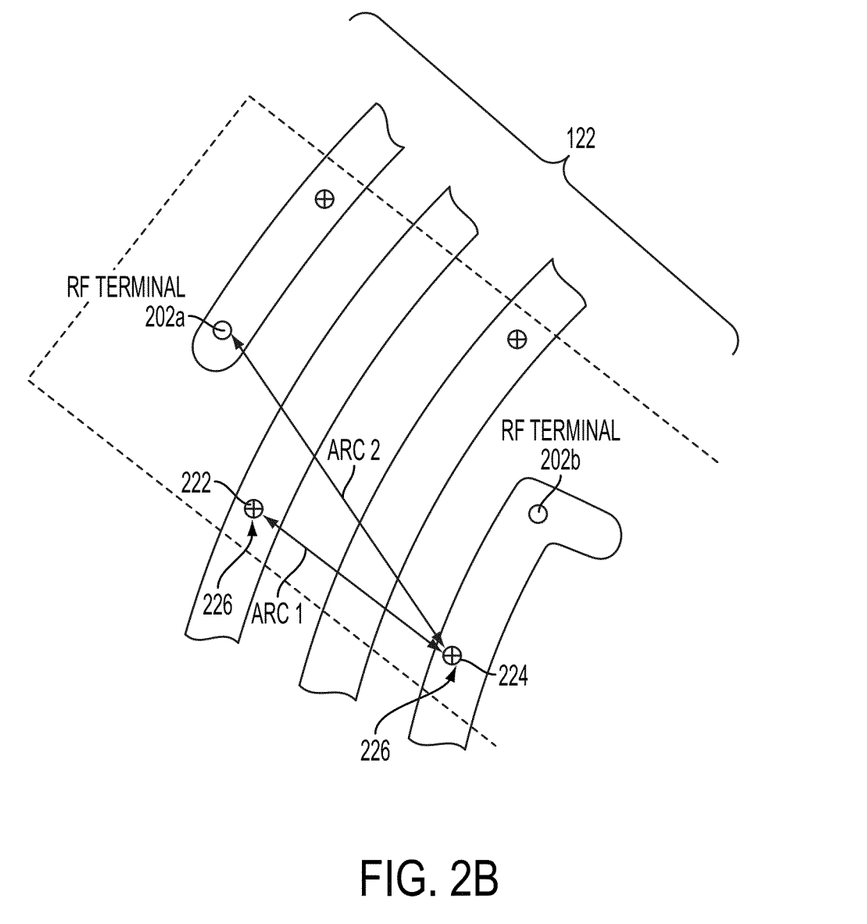
FIG. 2B illustrates an example of screw hole configurations along an outer coil of the TCP coil, and possible arcing between screw hole locations and the respective screws.

In the illustration of FIG. 2B, a cutout of the outer coil 222 circled in FIG. 2A is shown. In this cut out, it is shown that arcing occurs between screw pairs 226 (ARC-1). It has also been observed that arcing occurs between screw 224 and RF terminal 202a. The resulting arcing has been studied, and it is believed that arcing is most likely to occur for conductive elements that are disposed proximate to each other, when a high voltage potential difference exists between the conductive elements, thus increasing the electric fields. An arcing event will therefore happen when the electric field reaches its air breakdown threshold, between the conductive elements.

As shown, the conductive TCP coil (for each of the inner and outer coils) circle/turn around more than once. At any particular location, if multiple sections of the TCP coil are present (i.e., because of the turns), such as the location shown in FIG. 2B, conductive elements that are disposed between outer and inner portions of the TCP coil will have a larger voltage potential difference. Because the current provided to a TCP coil stays constant, the voltage drop at any particular location will depend on the number of turns of the TCP coil. For this reason, there is a lower voltage potential drop between screw 222 and RF terminal 202a, although the separation between screw 222 and RF terminal 202a is less than the distance between 202a and screw 224. Likewise, the screw pairs 226 are arranged in a radial orientation away from each other, wherein screw 224 and screw 226 are substantially radially aligned. However, because screw 222 and screw 224 are connected to the RF coil 122, and at least two turns of the coil have occurred at this location, the voltage potential drop between the screw pairs 226 will be larger.

Figure 2C:
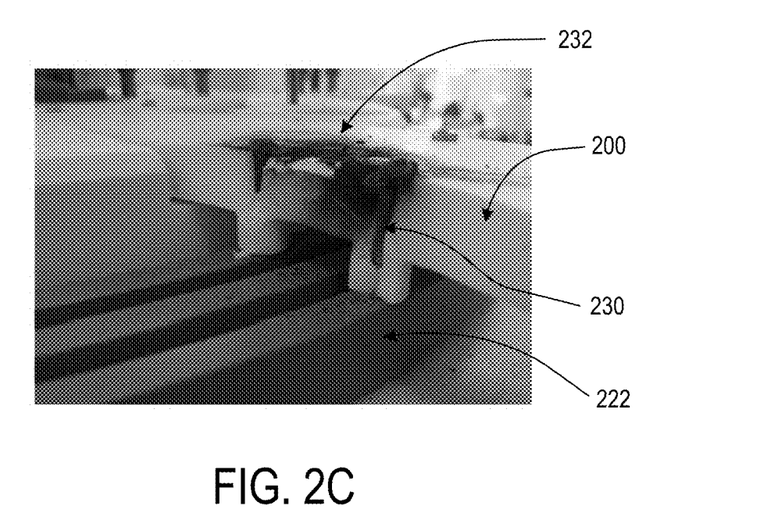
FIGS. 2C and 2D illustrate examples of damage caused by arcing between screws that are disposed through the ceramic support, for holding and sporting the TCP coil over the ceramic window of the chamber.
Figure 2D:
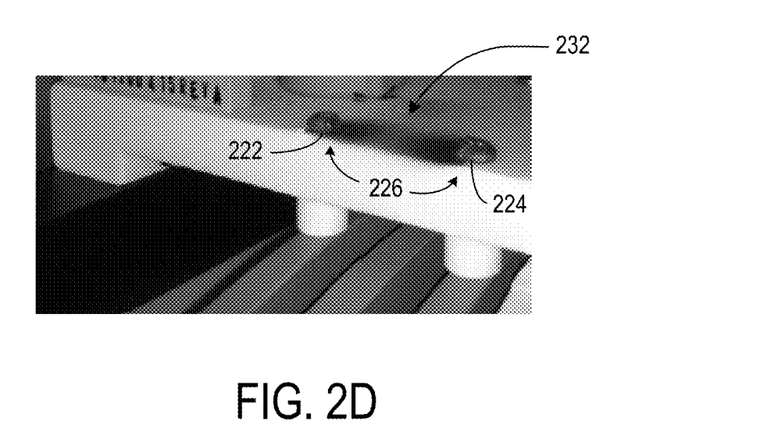

Referring to FIGS. 2C and 2D, it is evident that damage 232 has occurred on the ceramic material of ceramic support 200. The damage 232 is shown as a charring of the ceramic material, which also can cause chipping, flaking, burning, or breakage 230 or complete destruction of ceramic support 200. In one embodiment, the RF power provided to ceramic support is designed to expand up to 2 kW power. However, it has been observed that arcing does and can occur at this operational power level. In some embodiments, and based on the desired processing operation, it is known that higher power levels extending up to 3 kW and 4.5 kW power are needed. Providing higher power to the RF coil will therefore expose the ceramic support 202 additional damage when particular screw pairs 226 continue to arc, and potentially damage ceramics 200 in those locations. As noted, the screws used in FIG. 2A, being fully threaded within the ceramic section and above the copper surface of the coil enhances the effect on the concentration of the electric (E) field. This increase in E field produces a concentration, which makes it easier to arc.

Figure 3A:
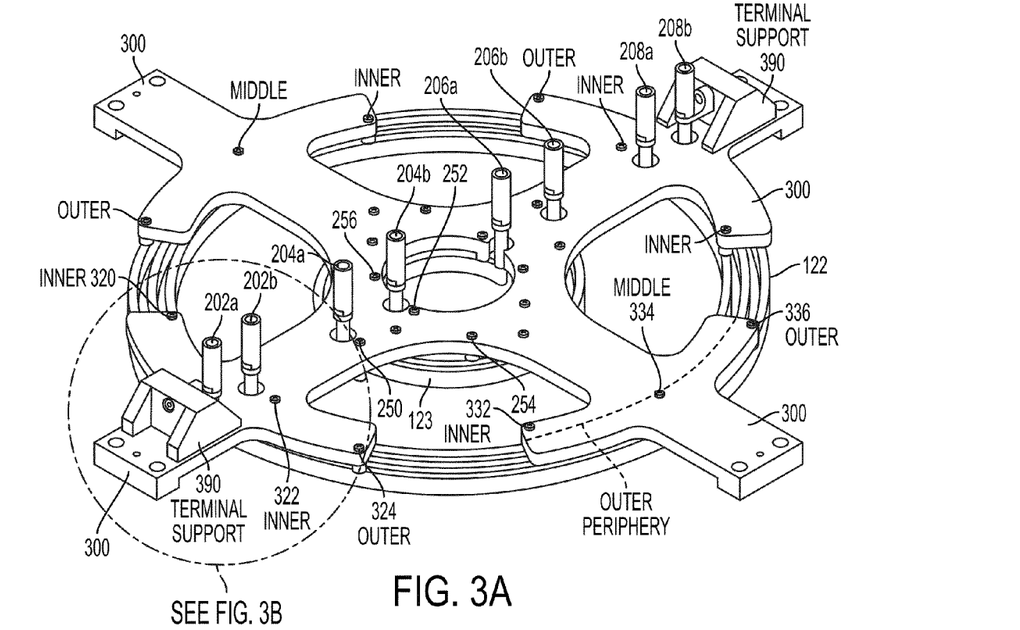
FIG. 3A illustrates an example of the ceramic support having a hammerhead configuration in the outer periphery of the spokes that originate from a center region, and the placement of screw holes and screws through the ceramic support for attaching, securing, or holding the TCP coil to the ceramic support, in accordance one embodiment of the present invention.

In one embodiment, FIG. 3A illustrates an example of a ceramic support 300 having a hammerhead configuration. The configuration is referred to as a hammerhead configuration because each termination of the ceramic support 300 includes a substantially symmetric extension away from the spoke. This extension, when viewed one spoke at a time appears to be a hammerhead shape, not unlike hammerhead shark. The ceramic support 300 includes four spokes, each extending from a center region. The four spokes are arranged along a terminal axis 360 and a support axis 370.

Along the terminal axis 360, a plurality of terminals 202a, 202b, 204a, 204b, 206a, 206b, and 208a, 208b are provided and expand through the ceramic support 300 for connection to the inner coil 123 and outer coil 122. A plurality of screws are shown to expand through the ceramic support 300 and connected to the inner coil 123 and outer coil 122. The arrangement of the screws is defined so as to provide separation between the adjacent screws that may have increased electric field differences between them, which may be due to increased voltage potential differences. As noted above, a greater voltage potential difference will exist between an outer portion of a coil that includes a plurality of turns and the inner portion of that same coil (any particular location). In one embodiment, the hammerhead shape of the ceramic support assists in increasing the separation between the screw pairs. In another embodiment, the terminal supports, such as those used for terminals 202a and 208b are elevated.

As will be discussed further below, the screws provided to hold the TCP coils to the ceramic support 300 includes smooth shanks, so as to avoid having threads in a region pathway of the ceramic support 300, and only providing threads for the portion that extends into the TCP coil for support. The advantage of having thread-less or smooth shanks is that such construction reduces the E field concentration caused by the screw threads, within the ceramic section. It is believed that this construction of the thread will reduce the possibility of arcing at higher power settings.

FIG. 3A also shows the positioning of various screws, associated with locations of the hammerhead sections of the spokes. For example, in the outlined portion provided in more detail in FIG. 3B, screws 320, 322, and 324 are shown. Screw 320 is located and connected to the inner portion of the outer coil 122. Screw 322 is located and connected to the inner portion of the outer coil 122, and screw 324 is connected to the outer portion of the outer coil 122.

Figure 3B:
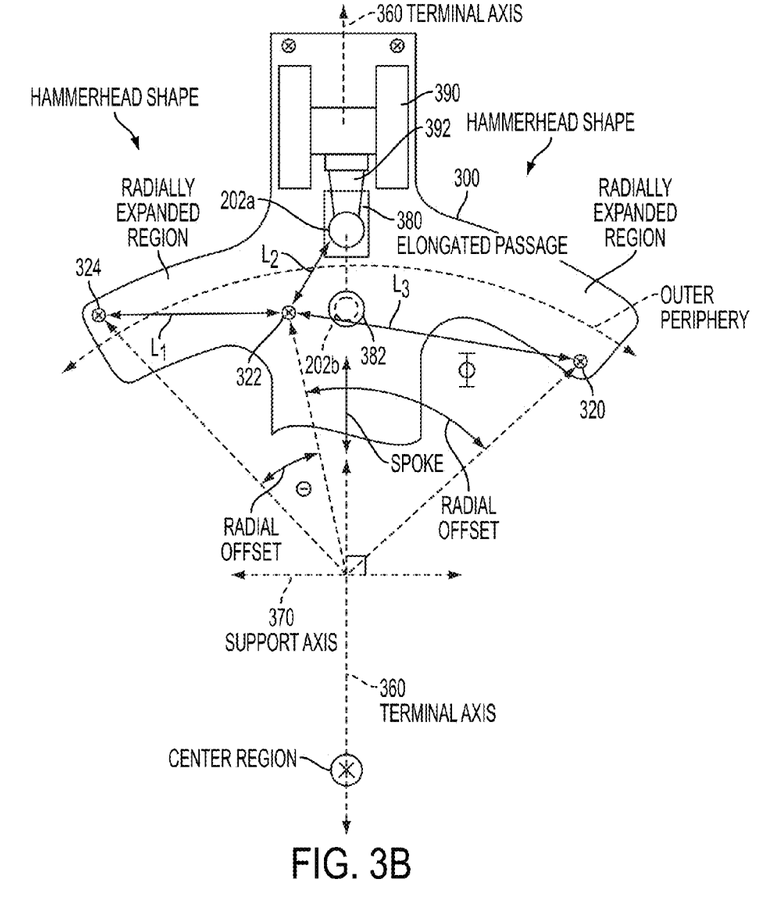
FIG. 3B illustrates an example of one section of the hammerhead shape, along a spoke of the ceramic support, showing the radial offsets between screws disposed in regions of the hammerhead shape, and showing the radial expanded regions of the ceramic support to define the hammerhead shapes at the ends or outer peripheries of the spokes, in accordance with one embodiment of the present invention.

It should be noted that the hammerhead construction is providing for the ability to separate screws 324 and 322. Although screw 322 is connected to the inner portion of the outer coil 121 and the outer screw 324 is connected to the outer portion of outer coil 121 (a condition that would provide for a higher voltage potential difference between the connections), the radial separation between the screws avoids the possibility of an arcing condition.

For instance, because the screws 324 and 322 are separated radially from each other, it is less likely that the electric field will increase between the two screws. That is, the E field between the two screws will find it difficult to provide a situation where the air breakdown threshold is reached, thus avoiding arcing at such location. FIG. 3 also shows other screws, such as screws 250, 252, 254, 256, and other screws that hold the ceramic support 302 the inner and outer coils. With reference to an adjacent spoke, such as the spoke including screws 332, 334, and 336, the hammerhead shape allows for the screws to be staggered such that adjacent screws are not disposed in an orientation where adjacent ones are exposed to a greater voltage potential difference.

For example, a greater voltage potential difference exists between inner screw 332 and outer screw 336. However, because the hammerhead shape allows for the screws to be radially separated from each other, the possibility of arcing is reduced. Although middle screw 334 is provided connected to the center portion of the outer electrode 122, a smaller voltage potential exists between screws 332 and 334, and screws 336 and 334, respectively.

Figure 3C:
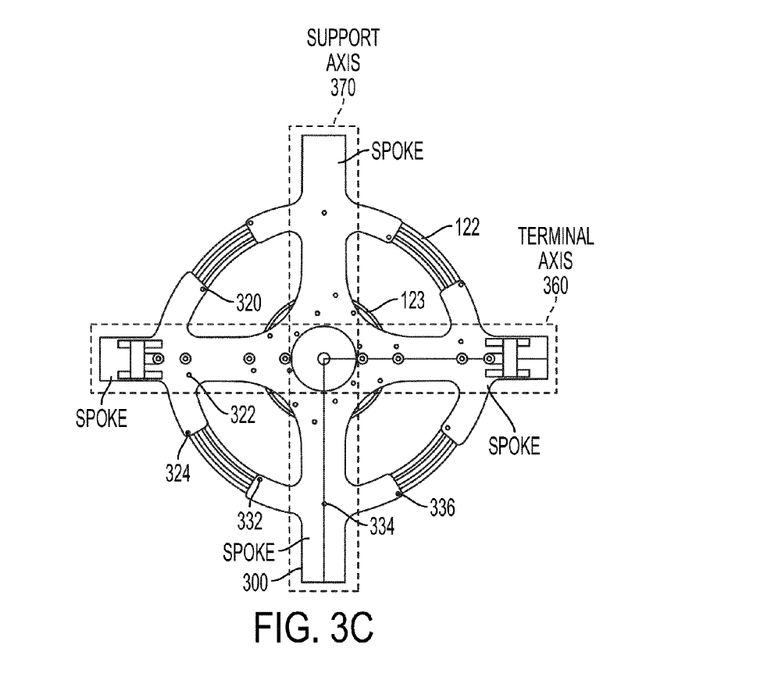
FIG. 3C illustrates a top view of the ceramics port and the hammerhead shapes, and the terminal axis and the support axis along which the spokes of the ceramic support expand, in accordance with one embodiment of the present invention.

FIG. 3C illustrates a top view of the inner and outer coils and the ceramic support 300. FIG. 3C illustrates how each of the spokes is associated with either the support axis 370 or the terminal axis 366. The terminal axis 366 is referred to as the "terminal axis" because the terminals are oriented and aligned along that specific axis. The support axis 370 however does not include terminals connected to the TCP coil.

FIG. 3B illustrates a detailed diagram of the hammerhead shape of ceramic support 300, for one of the spokes of the structure shown in FIG. 3A. In this example, the hammerhead shape allows for a greater separation between screws 322 and 324, shown as L1. The separation L1 is provided by allowing for screw 324 to be radially extended to the outer portion of the hammerhead shape. The radial separation is illustrated as Greek letter theta in the diagram. In the same construction, screw 320 is provided with a separation L3 from screw 322. This separation is also provided for by the hammerhead shape which allows for a radial separation between the screws, shown as Greek letter phi.

Without the hammerhead shape, the possibility to extend the separation between specific screws would not be possible. It is also not desirable to cover the entire surface over the coils with a solid circular ceramic support. If the ceramic support 300 were allowed to be continuous all the way around the outer coil 122, the heat generated by the outer coil 122 would damage the ceramic support 300. Therefore, a balance is provided by enabling hammerhead extension to each of the spokes for supporting the outer coil 122, and providing separation between screws that may be susceptible to higher electric fields (large voltage potential differences).

FIG. 3B also shows the location of passages 380 and 382. Passages 383 and 382 are provided to allow the terminals 202a and 202b to extend through the ceramic support 300. In one embodiment, passages 380 and 382 are provided with a gap between the terminals. The gap is an airspace such that contact is not made between the terminals and the ceramic support 300. Additionally, the terminals and their support structures are configured to avoid contact with the ceramic support 300. In one implementation, and terminal support 390 is provided, which couples to an extension 392.

Extension 392 is configured to couple and support terminal 202a. The terminal support 390 and the extension 392 work together so that the terminal 202a does not contact the ceramic support 300 and the terminal 202a remains spaced apart from the sidewalls of the passage 380. As shown in FIG. 3A, the terminal support 390 is located along the terminal axis 360. In this embodiment, the terminal axis 360 and the support axis 370 are oriented perpendicular to each other. In other embodiments, it is possible that additional spokes can be provided and the size and shape of the hammerheads can be curtailed to fit the specific embodiment.

For example, for chambers that operate and process on larger wafers than 300 mm wafers (e.g. 450 mm wafers, and larger), the number of spokes can be increased and the sizing of the hammerheads can be adjusted. It is possible that an additional spoke can be added between the existing spokes for large wafer chambers, and additional hammerheads can be disposed at the ends of those additional spokes.

Figure 3D:
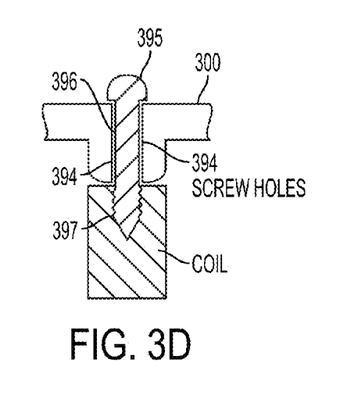
FIG. 3D illustrates an example of a screw used to support or connect the coil to the ceramic support, and the non-threaded region or portion of the screw that sits in the ceramic support holes, and the threaded region that connects to the coil, in accordance with one embodiment of the present invention.

FIG. 3D illustrates an example of one of the screws used to support the TCP coil to the ceramic support 300. The example screw is screw 395. Screw 395 is a stainless steel screw where a portion of the screw is configured to be smooth or unthreaded. That portion of the screw is the portion that fits or sits within a pathway 394 defined in the ceramic support 300. The pathway is preferably a screw hole without threads disposed in the ceramic support 300. The ceramic support 300 will also include a post feature in the regions where the through holes 394 are present, such that a separation between the coil and the ceramic support 300 top surface can be maintained. The post will therefore act as an extension and the pathway along the ceramic support 300 and the post will preferably be smooth and unthreaded, just as the screw 395 is unthreaded in that same location.

In this illustration, the screw 395 will include a threaded portion 397. The threaded portion 397 will threaded into a female friend of the coil that it's designed to support. As noted above, it is believed that a smooth surface between the screw 395 and the ceramic support 300 will assist in removing electric field concentrations in those locations.

For example, providing no threads on the screws 395 in the location/region adjacent to the ceramic support 300 (i.e., in the hole channel) has shown to reduce the electric field concentration and reduce damage by over 30%, as compared to full threaded screws This reduction in damage is in addition to the reduction in damage achieved by providing the hammerhead shapes, which allows for more radial separation between screw locations along the periphery of the ceramic support (i.e., around the outer coil region). In sum, damage for operating power levels to the TCP coil ranging up to 2 kW and up to about 4.5 kW can be dramatically reduced or substantially eliminated. Testing has shown that damage that used to be caused when operating at 2 kW is now non-apparent from visual inspection, and similar beneficial results have been shown up to 4.5 kW. It is noted that higher power levels can be achieved, and the example of 4.5 kW is only provided for reference, based on experimental testing.

Figure 4A:
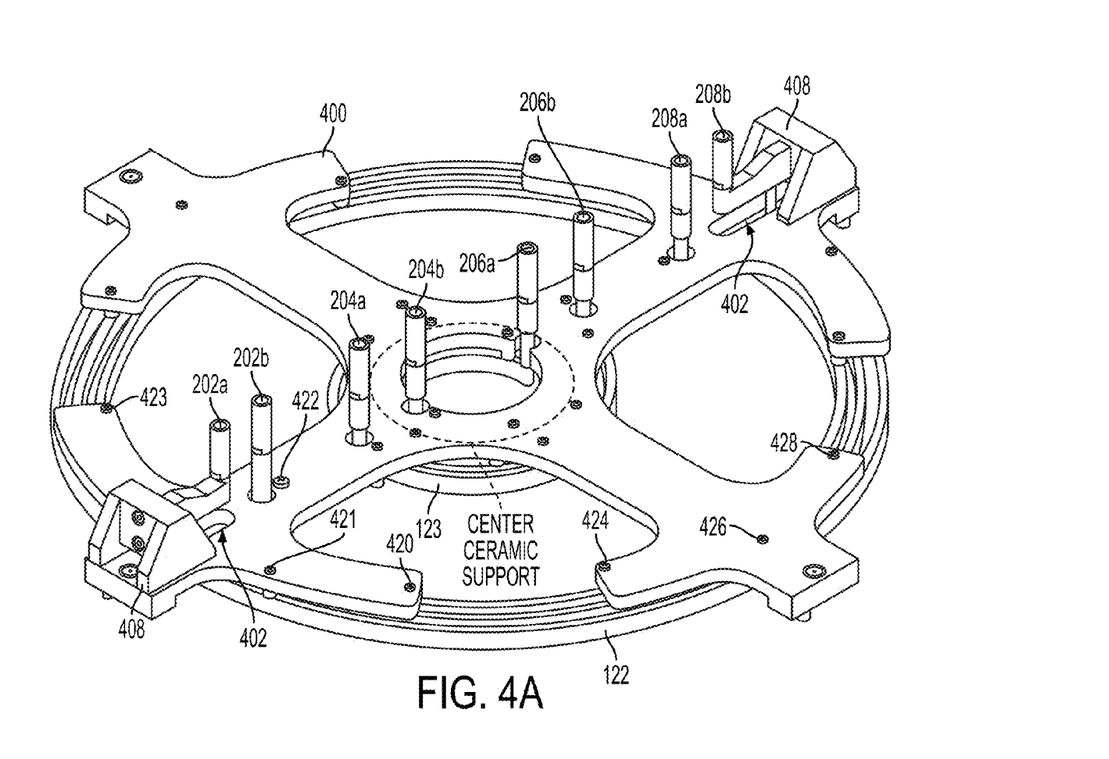
FIG. 4A illustrates another example of a ceramic support having a slightly adjusted configuration for enabling outer terminals to expand through the ceramic support via elongated passages, and the terminal supports disposed at the outer and of the spokes that are arranged along the terminal axis, in accordance with one embodiment of the present invention.
Figure 4B:
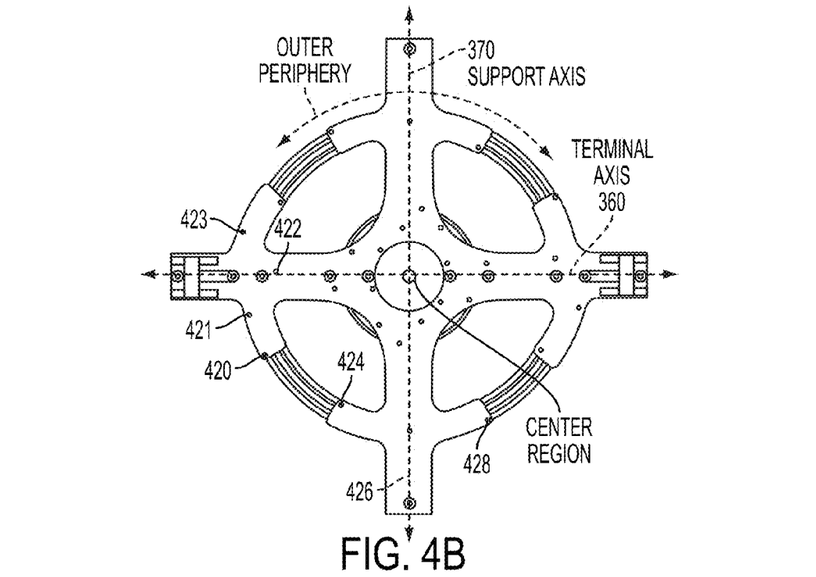
FIG. 4B illustrates a top view of the embodiment of FIG. 4A, showing that the hammerhead shapes are arranged along an outer periphery relative to a center region, and gaps of spaces between the hammerhead shapes are provided to prevent a continuous coverage over the outer TCP coil.

FIGS. 4A and 4B illustrate an example of a hammerhead ceramic support 400, in accordance with another embodiment of the present invention. In this configuration, the ceramics port 400 includes a slightly modified construction in region 402, which is the region where terminals 202a and 208b are designed to fit through or extend through. A body of terminals 202a and 208b are designed to connect to the terminal supports 408 stability. It should be noted that a slightly larger passage in the ceramic support 400 in region 402 is provided, such that the bodies of the terminals can fix and slide through the end portions of the hammerhead shape.

Similar to the construction and orientation of the screws in FIG. 3A, the screws oriented along the hammerhead portions of ceramic support 400 also provide for separation between screws that may be susceptible to arcing at higher power configurations. The hammerhead shape allows for the radial separation of the screws, which may be connected to coil section turns that may produce higher voltage differentials, and would therefore be susceptible to higher electric fields and resulting damage. Advantageously, the hammerhead shape allows for the radial separation of the screws, and avoids problems associated with arcing. As illustrated, one of the hammerhead sections of ceramic support for her to include screws 423, 422, 421, and 420.

The separation between 420 and 421 is provided by its radial separation along the hammerhead shape of the ceramic support 400. Screw 420 is connected to an inner portion of the outer coil 122 and screw 421 is connected to the outer portion of the outer coil 122. This configuration would have caused problems with arcing if the screws where more radially aligned, but by providing the radial separation along the extended portion of the hammerhead shape, arcing is avoided. The same benefits are associated with screws 424, 426, and 428.

Figure 5A:
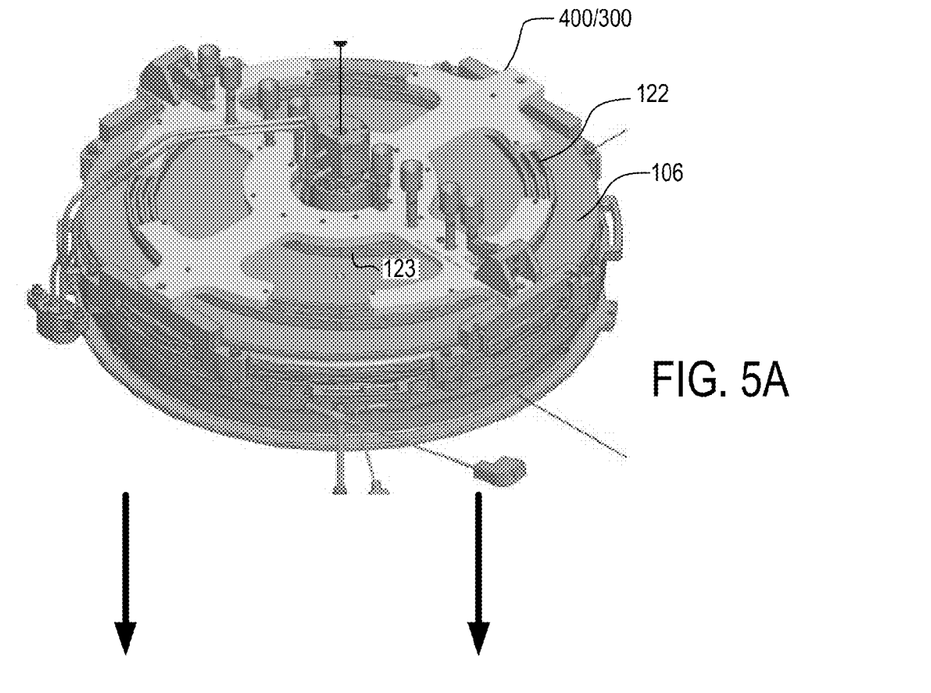
FIGS. 5A and 5B illustrate an example where the ceramic support is installed in a chamber used for processing semiconductor devices, and the ceramic support is holding or supporting the TCP coil over a dielectric window, without allowing direct contact (i.e., spaced apart) of the TCP coil to the dielectric window, in accordance with one embodiment of the present invention.
Figure 5B:
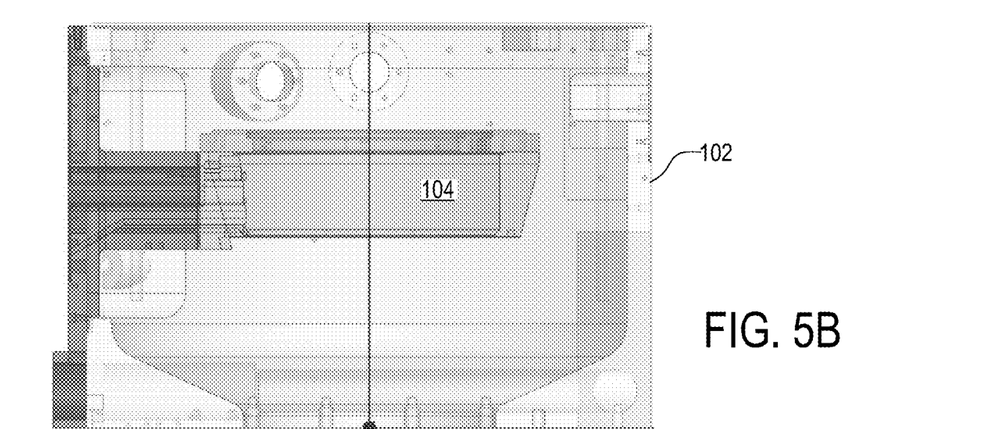

FIG. 5A illustrates an example where ceramic support 400 is connected to a top portion of a chamber 102 shown in FIG. 5B. The top portion includes a ceramic window 106, which is proximate or adjacent to the TCP coil. The chamber 102, shown in FIG. 5B includes a chuck 104 (i.e., substrate support), which is designed to receive a wafer (not shown). In one embodiment, and without limitation to other process configurations, the chamber 102, having the hammerhead ceramic support may be used for fabricating operations to make magneto-resistive random access memory (MRAM) devices. In the example of FIG. 5A, the hammerhead ceramic support is used with an air cooled Faraday shield.

It should be understood that any type of etching process can take advantage of having a supportive TCP coil, with the ceramic support configurations disclosed in the above-described embodiments. As noted earlier, the embodiments described herein may be applicable to processing in chambers that are designed for 300 mm wafers. It should be understood that the chambers can also be configured for other sizes, such as 450 mm wafers. When larger wafers are processed in larger configured chambers, the sizes of the relevant parts may increase. For example, the ceramic support 300/400 can also increase in diameter.

It is possible that additional spokes may be provided, and additional radius is of hammerhead features can be provided for each radius. For example, in a 300 mm configuration, and inner coil is provided and an outer coil is provided. It is envisioned that in larger chambers, such as those that would process 450 mm wafers, three coil rings (sets) would be provided. Thus, there would be an inner coil, a middle coil, and an outer coil. In one embodiment, it is possible that the hammerhead shapes can be provided for the inner coil as well as for the outer coil, with respective spokes providing extensions to those specific regions. In other embodiments, it is also possible to arrange the terminals along more than just one axis. That is, instead of just having terminals extending through the ceramic body along a single axis, it is possible that terminals connected to the TCP coil can extend up along the support axis. For larger chambers, it is possible that terminals can extend through an up along multiple spokes, depending on the routing configuration for the connections to the various coils.

In one embodiment, without limitation, advantages provided by the embodiments described herein include: a feature that the hammerhead shape of the ceramic support, which increases the separation between the screw pairs; a feature that that terminals are elevated from the ceramic support and are provided with ceramic cutouts (passages) around the outmost terminals to reduce the E field around the outmost terminals; and a feature that smooth shank screws are used to mount the coil to the hammerhead ceramic support (which eliminates or reduces the E field concentration caused by the screw threads in the ceramic section).

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A plasma processing system including a substrate support, comprising,
   a chamber for plasma processing a substrate when disposed over the substrate support of the chamber, the chamber having a ceramic window oriented over the substrate support;
   a transformer coupled plasma (TCP) coil defined by an inner coil and an outer coil, the TCP coil disposed over the ceramic window;
   a ceramic support disposed over to the TCP coil, the ceramic support includes a plurality of spokes that extend from a center region to an outer periphery, each of the spokes include a hammerhead shape that radially expands the ceramic support in a direction that is away from an axis of a spoke; and
   a plurality of screws connecting TCP coil to the ceramic support, wherein at least a pair of screws connected to the outer coil are radially offset from each other and one of the pair of screws is disposed in the hammerhead shape;
   wherein the ceramic support, using the plurality of screws, support the TCP coil over the ceramic window of the chamber.

2. The plasma processing system as recited in claim 1, wherein the ceramic support includes a plurality of screw holes for receiving the plurality of screws, the plurality of screw holes being non-treaded; and
   wherein each of the plurality of screws includes a non-threaded section and a threaded section, the non-threaded section defined to sit in the non-threaded screw holes and the threaded section defined to thread into a threaded of the TCP coil.

3. The plasma processing system as recited in claim 1, wherein the plurality of spokes are aligned along a support axis and a terminal axis.

4. The plasma processing system as recited in claim 3, further comprising,
   a first terminal support connected to the ceramic support at a first end of a spoke aligned along the terminal axis; and
   a second terminal support connected to the ceramic support at a second end of the spoke aligned along the terminal axis.

5. The plasma processing system as recited in claim 4, wherein the first and second terminal supports connect to a first terminal body and a second terminal body, respectively, the first and second terminal bodies being held elevated off of the ceramic support by the first and second terminal supports.

6. The plasma processing system as recited in claim 3, further comprising,
   a plurality of passages defined along the terminal axis, the passages being sized to enable terminals connected to the TCP coil to pass through and reside without contact maintained by a spacing with the ceramic support.

7. The plasma processing system as recited in claim 1, wherein the ceramic support includes elongated passages under terminals of the TCP coil at opposite outer ends of spokes aligned along the terminal axis.

8. The plasma processing system as recited in claim 1, wherein the radial offset is an angle that extends from a center region of the ceramic support and extends to screw holes defined in the outer periphery of the ceramic support.

9. The plasma processing system as recited in claim 1, wherein on one of the spokes three screws are provided, wherein a first screw is disposed through a first side of the hammerhead shape, a second screw is disposed through a spoke region, and a third screw is disposed through a second side of the hammerhead shape, wherein the first side, the second side and the spoke region define the hammer head shape.

10. The plasma processing system as recited in claim 9, wherein the first screw connects to an inner portion of the outer coil, the second screw connects to a middle portion of the outer coil, and the third screw connects to an outer portion of the outer coil.

11. A device for use in a plasma processing system, comprising,
    a ceramic support having a plurality of spokes that extend from a center region to an outer periphery, each of the spokes include a hammerhead shape that radially expands the ceramic support in a direction that is away from an axis of a spoke; and
    a plurality of screw holes disposed through the ceramic support, the plurality of screw holes defined to enable screws to connect to a TCP coil having an inner and outer coil, wherein the outer coil is to be disposed under the hammerhead shape of each of the spokes, wherein a radial gap is defined between each of the hammerhead shapes, the radial gap defining a non-continuous ring around the outer coil.

12. The device of claim 11, wherein at least a pair of screw holes are radially offset from each other and one of the pair of screw holes is disposed in the hammerhead shape.

13. The device of claim 11, further comprising,
    a plurality of screws, the plurality of screws defined to fit through the screw holes, the screws including a non-threaded section and a threaded section, the non-threaded section configured to reside in the screw holes and the threaded sections configured to thread into the TCP coil.

14. The device of claim 11, wherein the plurality of spokes include four spokes, wherein two spokes are aligned along a support axis and two spokes are aligned along a terminal axis.

15. The device of claim 14, further comprising,
    a first terminal support connected to the ceramic support at a first end of a spoke aligned along the terminal axis; and
    a second terminal support connected to the ceramic support at a second end of the spoke aligned along the terminal axis.

16. The ceramic support of claim 14, wherein the first and second terminal supports connect to a first terminal body of the TCP coil and a second terminal body, respectively, the first and second terminal bodies being held elevated off of the ceramic support by the first and second terminal supports.

17. The device of claim 14, further comprising a center ceramic support, the center ceramic support defining a loop that is disposed over the inner coil of the TCP coil when present, the center ceramic support defining a structure form which the spokes extend out from to the hammer head shapes.

18. A chamber, comprising:
    walls that defines a volume for processing plasma, the chamber having a ceramic window disposed in a ceiling of the chamber;
    a ceramic support having a plurality of spokes that extend from a center region to an outer periphery, each of the spokes include a hammerhead shape that radially expands the ceramic support in a direction that is away from an axis of a spoke; and
    a plurality of screw holes disposed through the ceramic support, the plurality of screw holes defined to enable screws to connect to a TCP coil having an inner and outer coil, wherein the outer coil is to be disposed under the hammerhead shape of each of the spokes, wherein a radial gap is defined between each of the hammerhead shapes, the radial gap defining a non-continuous ring around the outer coil; and a plurality of screws disposed through the screw holes for attaching the TCP coil to the ceramic support, the ceramic support disposing the TCP coil over the ceramic window.

19. The chamber of claim 18, wherein at least a pair of screw holes are radially offset from each other and one of the pair of screw holes is disposed in the hammerhead shape.

20. The device of claim 18, wherein the screws include a non-threaded section and a threaded section, the non-threaded section configured to reside in the screw holes and the threaded sections configured to thread into the TCP coil.

* * * * *